United States Patent

[19]

Weiner

[11] 4,024,397
[45] May 17, 1977

[54] SHOCK RESISTANT ENCAPSULATED INFRARED DETECTOR

[75] Inventor: Seymour L. Weiner, Stamford, Conn.

[73] Assignee: Barnes Engineering Company, Stamford, Conn.

[22] Filed: Sept. 28, 1970

[21] Appl. No.: 75,895

[52] U.S. Cl. .................. 250/338; 250/216; 250/353
[51] Int. Cl.$^2$ ............................. G01J 1/00
[58] Field of Search .............. 338/18; 250/83.3 H, 250/338, 340, 353, 216, 252

[56] References Cited

UNITED STATES PATENTS

| | | | |
|---|---|---|---|
| 2,423,476 | 7/1947 | Billings et al. | 338/18 |
| 2,981,913 | 4/1961 | Barnes et al. | 338/18 |
| 2,983,888 | 5/1961 | Wormser | 338/18 |
| 2,994,053 | 7/1961 | De Waard | 250/353 |
| 3,075,386 | 1/1963 | Daly | 338/18 |
| 3,188,593 | 6/1965 | Vasel et al. | 338/18 |
| 3,239,675 | 3/1966 | Morey et al. | 250/338 |
| 3,368,078 | 2/1968 | Flint et al. | 250/353 |
| 3,629,585 | 12/1971 | Desuignes et al. | 250/83.3 H |

*Primary Examiner*—Maynard R. Wilbur
*Assistant Examiner*—S. C. Buczinski
*Attorney, Agent, or Firm*—Joseph Levinson

[57] ABSTRACT

A rugged construction for an optically immersed infrared detector is provided along with a method of fabrication which produces an infrared detector which can withstand shock, vibration and high acceleration levels. A metallic base is formed with a cavity therein, along with electrical feed-through pins and a relief channel. Lead patterns are deposited on a thin sheet of insulating material and infrared detectors are mounted on the lead patterns and the sheet is assembled in the cavity of the base with the feed-through pins being connected to the lead pattern which makes electrical connections to the infrared detector through the appropriate feed-through pins. The cavity is filled with an immersion material and an infrared window, which may be in the form of a lens, is pressed into its seat in the base conveniently formed by a ledge surrounding the cavity. As the infrared window is positioned on its seat, any excess immersion material flows through the relief channel, and the assembly so formed is cured so that the immersion material solidifies.

5 Claims, 2 Drawing Figures

INVENTOR.
SEYMOUR L. WEINER
BY *Joseph Levinson*
ATTORNEY

SHOCK RESISTANT ENCAPSULATED INFRARED DETECTOR

BACKGROUND OF THE INVENTION

For most radiation detectors the detectivity increases with decreasing detector area. Conventional infra-red optical systems use reflecting or refracting elements made from special infrared optical materials with broad spectral transmission. There are practical limits to the optical gain which can be achieved using such optical systems, as such systems can be difficult and expensive to make in large sizes, and the equipment in which they are mounted becomes increasingly bulky. A practical approach which has been taken is to achieve optical gain directly at the detector using relatively small optical elements. This has been achieved by the immersed detector in which the infrared window, generally in the form of a lens, is in optical contact with the infrared detector. The lens, referred to as an immersion lens, may be of any suitable material, such as fused aluminum oxide, a type of dielectric material, or a semiconductor material such as germanium or silicon. The type of lens material used with depend on the particular application, and generally where increased responsivity is required, semiconductor lenses, such as germanium, which has a refractive index of 4, will be used.

In adhering the infrared detector to the infrared window to provide the optical contact between the lens and the infrared detector, there is provided a very thin layer of insulating material which is generally glass-like, such as selenium modified with arsenic glass. Other types of immersion material may be utilized in accordance with a given application. The immersion material performs the additional function of providing a path of moderate thermal impedance between the infrared detector and the lens which in many cases acts as a heat sink for the detector. In thermistor bolometers, if a semiconductor window or lens is utilized, the immersion material acts as an insulator for preventing the shorting out of the thermistor flake. Immersing the infrared detector, such as the thermistor flake, on the lens involves an extremely delicate operation which is generally carried out under a microscope. For the thermistor bolometer, for example, sheets of pastes of oxide are made up, cut into tiny flakes of the desired size, and then sintered and annealed. The flakes are very thin, for example on the order of 10 microns or less, and are very fragile. So that electrical connections can be made to the flake, it is necessary to deposit a conductor such as gold on a masked thermistor flake to produce lead areas to which leads such as platinum wires may be attached. An area on the back of the window or immersion lens where the flakes are to be mounted is coated with a thin film of immersion glass, for example 10 microns, and the layer is generally applied thereto by vacuum deposition. Each thermistor is then placed on the immersion glass layer, with a weight placed thereon, and the flake assembly centered on an optical mechanical axis of the lens. The preimmersion assembly is placed in an oven and the temperature raised to the softening point of the immersion glass wherein the weights on the thermistor flake cause it slowly to sink into the softened glass until spacing from the back of the lens has reached the desired value, whereupon the heat is turned off and the bolometer is cooled slowly. This is a delicate operation and requires continuous observation by highly skilled personnel. When the operation is finished, a very delicate detector is produced with lead wires connected thereto which must be connected to bases or external circuitry with great care.

Accordingly, it is an object of the present invention to provide an improved construction for an immersed type infrared detector which is simple to fabricate and far more rugged than the prior art type of immersed detectors.

A further object of this invention is to provide a new and improved construction for an immersed type infrared detector which can withstand vibration, shock, and high acceleration levels without damage thereto.

SUMMARY OF THE INVENTION

In carrying out this invention in one illustrative embodiment thereof, the infrared detector means are mounted on a thin sheet of insulating material which has an external lead pattern deposited thereon connected to the infrared detector means mounted thereon. A base member is formed having a cavity therein surrounded by an immersion window seat in the form of a ledge and the cavity is provided with a relief channel. The base also has electrical feedthrough pins mounted through the bottom into the cavity. The infradetector means of the sheet of insulating material is mounted in the bottom of the cavity with the lead pattern thereon connected to the feedthrough pins and the cavity is filled to or above the ledge area, and the infrared window is seated on the ledge, forcing any excess immersion material out the relief channel. The assembly is cured, thus producing a rugged construction which can withstand shock, vibration and high acceleration rates.

DESCRIPTION OF THE PREFERRED EMBODIMENT

The preferred embodiment of this invention will be described in connection with an immersed thermistor bolometer. It will be readily appreciated by those skilled in the art that the type of construction taught herein may be utilized in the construction of other types of immersed infrared detectors, such as other thermal detectors, the pyroelectric detector, and photoconductive infrared detectors. The lead patterns, infrared windows, and immersion materials may vary in accordance with the application and particular type of infrared detectors which are utilized, but the construction and method of fabrication will be the same.

Figure 1:
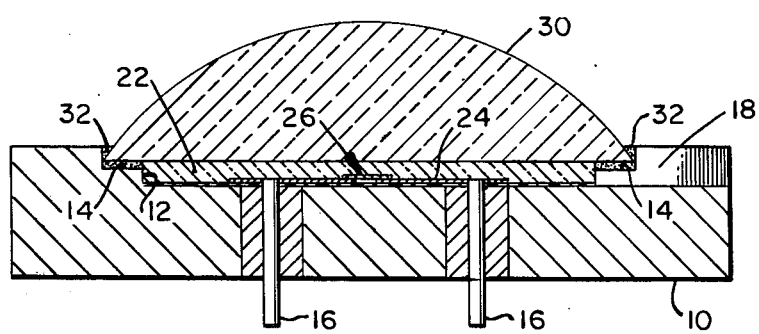
FIG. 1 is a cross-sectionl view of the immersed infrared detector construction embodied in this invention.
Figure 2:
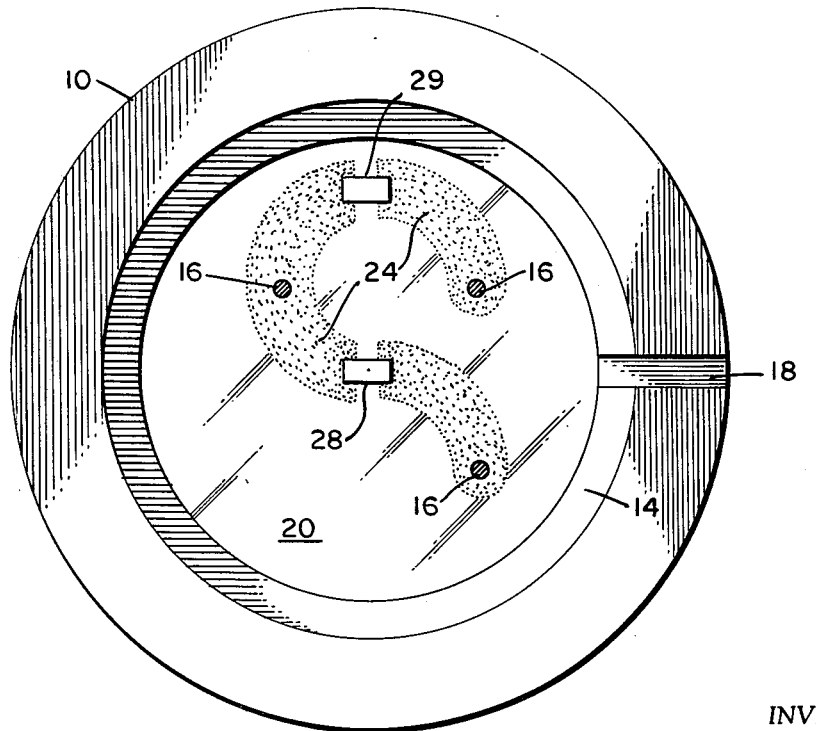
FIG. 2 is a top view of the immersed infrared detector construction of FIG. 1 with the immersion lens and immersion material removed.

Referring now to FIG. 1, the infrared detector assembly includes a base 10 which is metallic, and may be aluminum or any other suitable metal. The base 10 has a cavity 12 therein bounded by a seat or ledge 14, and a relief valve 18 extending therefrom through the base 10. The base 10 is also provided with a plurality of feedthrough pins 16 which protrude from the base and extend into the cavity 12. Positioned in the bottom of the cavity 12 is a thin sheet of material of poor thermal conductivity, such as polyglycol terephthalate, sold under the trademark Mylar. As will best be seen in FIG. 2, the Mylar sheet 20 has a vapor-deposited lead pattern 24 connected to the thermistor bolometer 26 which is comprised of an active flake 28 and a compensator flake 29. The active flake 28 and the compensator flake 29 of the thermistor bolometer 26 are connected conventionally in a bridge circuit with a source of bias supply in opposition with the compensator flake masked off from the field of view of the active flake (not shown). Under normal operating conditions no signal appears at the output of the thermistor bolometer 26 when the active flake views the background radiation which is the same as the environment or temperature of the compensator flake. As radiation from an object in the field of view is applied to the active flake, a differential signal appears at the output of the detector 26 which represents the temperature of the object in the field of view. A compensating flake may or may not be used, as desired. This would apply to other types of infrared detector means as well. The Mylar sheet 20, with its thermistor bolometer 26 and vacuum deposited lead pattern 24, is cemented to the bottom of the cavity 12 and the lead pattern 24 is connected to the feedthrough pins 16. An immersion material 22 fills the cavity 12. As was pointed out, the immersion material may be any suitable material, such as modified selenium glass, other component glasses, or various forms of resin liquids which harden at room temperature. An infrared window 30, which is transparent to the infrared radiation which is desired to be measured, is seated on the ledge 14 and held thereto by an epoxy resin 32. The infrared window 30, which is preferably in the form of a lens, and hereafter referred to as such, may be of any suitable material compatible with the particular detector application and immersion material.

In fabricating the aforesaid rugged construction for an immersed infrared detector means, the metallic base 10 is machined or coined in the manner shown, with the cavity 12 having a ledge 14 and a relief channel 18 therein. Feedthrough pins 16 are then assembled in base 10, as shown in FIG. 1. A thin Mylar sheet 20 has a lead pattern vapor deposited thereon, with the thermistor flakes 28 and 29 attached thereto with the lead pattern providing the electrical connection to the thermistor flakes. The thin Mylar sheet 20 is cemented to the floor of the cavity with the lead pattern 24 facing the lens 30. The feedthrough pins are suitably electrically connected to the lead pattern to provide electrical connections between the thermistor flakes 28 and 29 and the appropriate feedthrough pins 16. The cavity 12 is prepared for assembly with the lens 30 by coating the lens seat 14 with epoxy resin, then overfilling the cavity 12 with the immersion material 22. Then the lens 30 is placed in position and pressed into its seat 14 in the base 10, whereupon the excess immersion material 22 will flow out through the relief channel 18 provided for this purpose. The assembly is then cured so that the immersion material solidifies. If the immersion material solidifies at room temperature, it is heated so that it softens and the lens may be forced inward, and the device is then allowed to cool. This would be the case for an immersion material such as the modified selenium glass. However, if a resin is used which is in liquid form at room temperature, it is cured by heating so that it solidifies.

The construction so described provides a completely encapsulated detector device. There are no unsupported wires or parts that will move under shock, vibration or high acceleration. Furthermore, the thickness of the Mylar layer and the immersion glass layer, which control the time constant of the detector, are well set and controlled in accordance with this construction. The technique lends itself to reduced cost for quantity production. For some applications, it may be desirable to encapsulate the first preamplifier stage for the detector. This may be done in the present invention by putting it in the detector base 10 and making the suitable connections to the vapor deposited lead pattern and its associated appropriate feedthrough pins.

The method of construction described above indicates a lens that has been fabricated prior to joining it with the base 10. It is also possible to select an immersion material that lends itself to the casting of a lens. Selenium glass would be an example of one such type material. This would permit the casting of the lens and the immersion material in one operation onto the base that contains the detector element.

Since other modifications and changes varied to fit particular operating requirements and environments will be apparent to those skilled in the art, the invention is not considered limited to the examples chosen for purposes of disclosure, and covers all modifications and changes which do not constitute departures from the true spirit and scope of this invention.

What is claimed is:

1. An encapsulated optically immersed infrared detector comprising
   a. a base member having a cavity therein surrounded by a ledge and electrical feedthrough pins mounted in said base member,
   b. a thin sheet of insulating material having infrared detector means mounted thereon and a lead pattern on said insulating material connected to said infrared detector means,
   c. said thin sheet with said infrared detector means thereon being mounted in the cavity of said base member with said electrical feedthrough pins being connected with the lead pattern thereon,
   d. a layer of immersion material positioned on said sheet and filling said cavity up to said ledge in said base member,
   e. an infrared window transparent to infrared radiation which is to be detected by said infrared detector means mounted on said ledge covering said cavity and being in intimate contact with said immersion material thereby providing infrared detector means which is optically immersed and encapsulated.

2. An encapsulated optically immersed infrared detector set forth in claim 1 having a relief channel in said base member connected to said cavity for handling overflow of immersion material when said window is mounted on the ledge of said base member.

3. An encapsulated optically immersed infrared detector set forth in claim 1 wherein said infrared window is in the form of a lens.

4. The method of fabricating an encapsulated optically immersed infrared detector comprising
   a. forming a base member having a cavity therein bounded by a ledge and a relief channel extending therefrom,
   b. attaching feedthrough pins to said base member,
   c. depositing a lead pattern on a thin sheet of insulating material substantially the size of said cavity and mounting an infrared detector means on said sheet in electrical contact with said lead pattern.

d. mounting said sheet in the bottom of said cavity with the lead pattern in electrical contact with said feedthrough pins,
e. filling said cavity with an immersion material,
f. mounting an infrared window on said ledge over said cavity with any excess immersion material flowing through said relief channel, and
g. curing the infrared detector means so formed.

5. The method set forth in claim 4 wherein the steps of filling said cavity and mounting an infrared window are performed simultaneously by casting of a lens and immersion material at the same time using the same material for the lens and immersion material.

* * * * *